United States Patent [19]
El-Kareh et al.

[11] Patent Number: 5,763,918
[45] Date of Patent: Jun. 9, 1998

[54] ESD STRUCTURE THAT EMPLOYS A SCHOTTKY-BARRIER TO REDUCE THE LIKELIHOOD OF LATCH-UP

[75] Inventors: Badih El-Kareh, Austin, Tex.; James Gardner Ryan, Newton, Conn.; Hiroyoshi Tanimoto, Kanagawa, Japan

[73] Assignee: International Business Machines Corp., Armonk, N.Y.

[21] Appl. No.: 740,134

[22] Filed: Oct. 22, 1996

[51] Int. Cl.$^6$ .................................................. H01L 23/62
[52] U.S. Cl. .................... 257/355; 257/361; 257/362; 257/477; 257/484
[58] Field of Search .................... 257/355, 356, 257/357, 476, 484, 486, 494, 477, 361, 362

[56] References Cited

U.S. PATENT DOCUMENTS

| | | | |
|---|---|---|---|
| 3,798,514 | 3/1974 | Hayashi et al. | 257/476 X |
| 4,260,431 | 4/1981 | Piotrowski | 148/1.5 |
| 4,310,362 | 1/1982 | Roche et al. | 148/1.5 |
| 4,871,686 | 10/1989 | Davies | 437/39 |
| 5,166,089 | 11/1992 | Chen et al. | 437/51 |
| 5,181,091 | 1/1993 | Harrington, III et al. | 257/355 |
| 5,250,834 | 10/1993 | Nowak | 257/350 |
| 5,281,841 | 1/1994 | Van Roozendaal et al. | 257/360 |
| 5,336,637 | 8/1994 | Nowak | 437/175 |
| 5,338,964 | 8/1994 | Bernier | 257/476 |
| 5,362,980 | 11/1994 | Gough | 257/355 |
| 5,432,368 | 7/1995 | Jimenez | 257/355 |
| 5,478,764 | 12/1995 | Inoue | 437/39 |
| 5,614,755 | 3/1997 | Hutter et al. | 257/476 X |

FOREIGN PATENT DOCUMENTS

| | | | |
|---|---|---|---|
| 61-58262 | 3/1986 | Japan | 257/476 |
| 64-51664 | 2/1989 | Japan | 257/356 |
| 1-152670 | 6/1989 | Japan | 257/356 |
| 1-246873 | 10/1989 | Japan | 257/476 |
| 3-108774 | 5/1991 | Japan | 257/362 |

*Primary Examiner*—William Mintel
*Attorney, Agent, or Firm*—Schmeiser, Olsen & Watts; Darryl Neff

[57] ABSTRACT

The preferred embodiment of the present invention overcomes the limitations of the prior art and provides a device and method to decrease the latch-up susceptibility of an ESD structure by suppressing the injection of minority carriers that cause transistor action to occur. This is accomplished, for example, by using a metal contact to the n-substrate or n-well in place of or in parallel with the prior art p-diffusion. Using such a metal contact forms a Schottky Barrier Diode (SBD) with the ESD structure. Since the SBD is a majority-carrier device, negligible minority carriers are injected when the SBD is in forward bias, thereby reducing the likelihood of latch-up.

8 Claims, 5 Drawing Sheets

ESD STRUCTURE THAT EMPLOYS A SCHOTTKY-BARRIER TO REDUCE THE LIKELIHOOD OF LATCH-UP

BACKGROUND OF THE INVENTION

1. Technical Field

This invention generally relates to electrostatic discharge structures, and more specifically relates to latch-up free electrostatic discharge structures.

2. Background Art

Modern semiconductor devices are highly susceptible to damage from exposure to electrostatic discharges (ESD). An ESD can be caused by static charge from machines or people touching the device. Many commonly used integrated circuits, such as MOSFETs, have structures such as gate oxides that can be easily broken down with as little as 10 volts. Because a typical ESD can range from several hundred to several thousand volts, such voltage must be kept away from the integrated semiconductor devices.

One method of protecting devices from ESD damage is to provide ESD protection structures that drain ESD current before the voltage damages the device, without interfering with the normal operation of the device. To do this an ESD structure is connected to every pin input on a chip. With the ESD structure connected in parallel to every pin input, ESD pulses can be safely drained away from the devices before damage is done to the device.

FIG. 1 is a top schematic view of a prior art ESD structure 100. Likewise, FIG. 2 is a cross sectional schematic view of prior art ESD structure 100 taken along lines 2—2 in FIG. 1. Referring to FIGS. 1 and 2 collectively, the ESD structure 100 comprises a dual diode structure that can be used to provide ESD protection in a variety of applications. The ESD structure 100 illustrated is particularly applicable for use in providing ESD protection to an off-chip driver. The ESD structure 100 is fabricated in a p-type substrate 104. The ESD structure comprises a guard ring 102 that defines the perimeter of the ESD structure 100. The guard ring 102 preferably comprises a n+ region 106 diffused into a n-well 108. The guard ring 102 is typically connected to a positive bias Vdd and serves to collect electrons injected within the ESD structure before the electrons diffuse toward neighboring circuits and cause latch-up there. Inside the guard ring 102 are a plurality of diffused regions comprising the dual diode ESD structure.

The ESD structure is also connected to bias Vdd at several diffusion regions inside the guard ring 102. In particular, Vdd is connected to n-diffusion 124 and n-diffusion 126, inside n-well 122. With Vdd connected to n-well 122, the n-well 122/p-substrate 104 junction is normally reversed biased, with no appreciable current flowing to p-substrate 104.

The ESD structure 100 is grounded through a plurality of substrate contact diffusions 110. These substrate contact diffusions 110 are preferably p-type diffusions that are formed directly in the substrate 104. Thus, these substrate contact diffusions 110 provide ground (Vss) reference to the ESD structure 100.

Three terminals, Output Vdd, Output Vss, and Input/Output, connect to regions inside the guard ring 102. These inputs are connected to corresponding inputs on the device to be protected from ESD damage.

For example, the ESD terminals denoted with Vdd, Vss, Output Vdd, Output Vss, and Input/Output are separately connected to the corresponding Vdd, Vss, Output Vdd, Output Vss, and Input/Output terminals of the off-chip driver. Thus, any ESD pulse on the input/output with respect to another terminal of the off-chip driver can be absorbed by the ESD structure 100 through the Input/Output terminal. Of course, this is just one application for which an ESD structure can be implemented.

Output Vdd is connected to an n-diffusion 112 in an n-well 114. As such, an ESD negative with respect to ground will forward biases the n-well 114/p-substrate 104 junction, and the current and voltage can be safely drained to ground. Likewise, an ESD positive with respect to Vss will cause a bias difference across the n-well 114/p-substrate 104 junction sufficient to cause a reverse junction breakdown. By designing the junction with a sufficiently low breakdown voltage the discharge current can be safely drained to ground before a damaging voltage appears at the off chip driver and other circuits.

Output Vss is connected to a p-diffusion 116 in n-well 118 and to p-diffusion 120 in n-well 122. Thus, an ESD pulse negative with respect to Vss will forward bias the n-well 118/p-substrate 104 junction, while reverse biasing the p-diffusion 116/n-well 118 junction. These two junctions back to back form a bipolar transistor with floating base. Similarly, the ESD pulse forward biases the n-well 122/p-substrate 104 junction while reverse biasing the p-diffusion 120/n-well 122 junction. The breakdown voltage is limited by either avalanche breakdown of the p-diffusion 116/n-well 118 junction or by the bipolar BVceo mode (base floating), whichever occurs first, at a voltage that does not damage the circuit.

In the transistor BVceo mode, the bipolar current amplification limits the breakdown voltage. For example, p-diffusion 116, n-well 118 and p-substrate 104 constitute a vertical bipolar PNP transistor. Under this bias condition, the base (n-well 118) is floating. The structure acts as a voltage divider whereby p-substrate 104 is the most positive node and p-diffusion 116 is the most negative node. The floating base "settles" at an intermediate voltage that slightly forward biases the n-well 118/p-substrate 104 junction. With the base floating and when appreciable current amplification is present, the transistor breakdown may be reduced to a lower voltage than the junction breakdown. This transistor breakdown is referred to as BVceo. Other NPN and PNP transistors in the ESD structure may exhibit similar behavior.

Input/Output is connected to n-diffusion 130 in n-well 118 and to p-diffusion 128 in n-well 122. Thus, an ESD pulse negative with respect to Vss forward biases the n-well 118/p-substrate junction such that current and voltage are safely drained to ground. Likewise, an ESD pulse positive with respect to Vdd forward biases the p-diffusion 128/n-well 122 junction, allowing current and voltage to be safely drained.

One problem with the prior art ESD structure is latch-up. Latch-up is caused by unwanted transistor action of elements in the ESD structure. For example, suppose an ESD pulse negative with respect to Vss "hits" the Input/Output terminal. This forward biases the n-well 118/substrate 104 junction. The structure composed of n-well 118, substrate 104, and n-well 122 acts as a lateral bipolar NPN transistor with n-well 118 as its emitter, substrate 104 as its base, and n-well 122 as its collector. N-well 118 injects electrons into substrate 104. The injected electrons are collected by n-well 122 and flow to n-well contacts 124 and 126 where they recombine. The voltage drop caused by current times resistance (IR-drop) in n-well 122 can forward bias the p-diffusion 120/n-well 122 junction.

The structure composed of p-diffusion 120, n-well 122 and substrate 104 acts as a vertical bipolar PNP transistor with p-diffusion 120 as its emitter, n-well 122 as its base, and substrate 104 as its collector. Holes injected from p-diffusion 120 into n-well 122 are collected by substrate 104 and flow to substrate contacts 110. The IR-drop in substrate 104 increases the forward bias on the n-well 118/substrate 104 junction. This causes more electrons to be injected from n-well 118 into substrate 104 and collected by n-well 122. The increased IR-drop in n-well 122 raises the forward bias on the p-diffusion 120/n-well 122 junction, and so on.

This positive feedback action can cause the NPNP structure to latch-up and the path between Vdd and Vss to go from a high-impedance to a low impedance mode, causing the voltage between the two terminals to drop to near 1V. Latch-up can be a destructive event. Of course, this is just one example of latch-up and where it can occur on ESD structure 100. Latch-up can occur at other NPNP or PNPN paths on ESD structure 100.

Thus, latch-up occurs where the ESD structure acts as interconnected bipolar transistors that feed on each other. What is needed then is a structure and method that improves on the prior art ESD design by lowering the probability of latch-up occurring.

DISCLOSURE OF INVENTION

The present invention provides a means of decreasing the latch-up susceptibility of a ESD structure by suppressing the injection of minority carriers in one or both parasitic bipolar transistors that are inherent components of the ESD structure. This is accomplished, for example, by using a metal contact to the n-substrate or n-well in place of or in parallel with the prior art p-diffusion. Using such metal contact forms a Schottky Barrier Diode (SBD) with the ESD structure. Since the SBD is a majority-carrier device, negligible minority carriers are injected when the SBD is in forward bias. Thus, the susceptibility to latch-up is greatly reduced.

It is thus an advantage of the present invention to increase the ESD immunity to latch-up without adding complexity or requiring larger area.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The preferred embodiment of the present invention overcomes the limitations of the prior art and provides a device and method to decrease the latch-up susceptibility of an ESD structure by suppressing the injection of minority carriers that cause transistor action to occur. This is accomplished, for example, by using a metal contact to the n-substrate or n-well in place of or in parallel with the prior art p-diffusion. Using such metal contact forms a Schottky Barrier Diode (SBD) with the ESD structure. Since the SBD is a majority-carrier device, negligible minority carriers are injected when the SBD is in forward bias, thereby avoiding latch-up.

Figure 3:
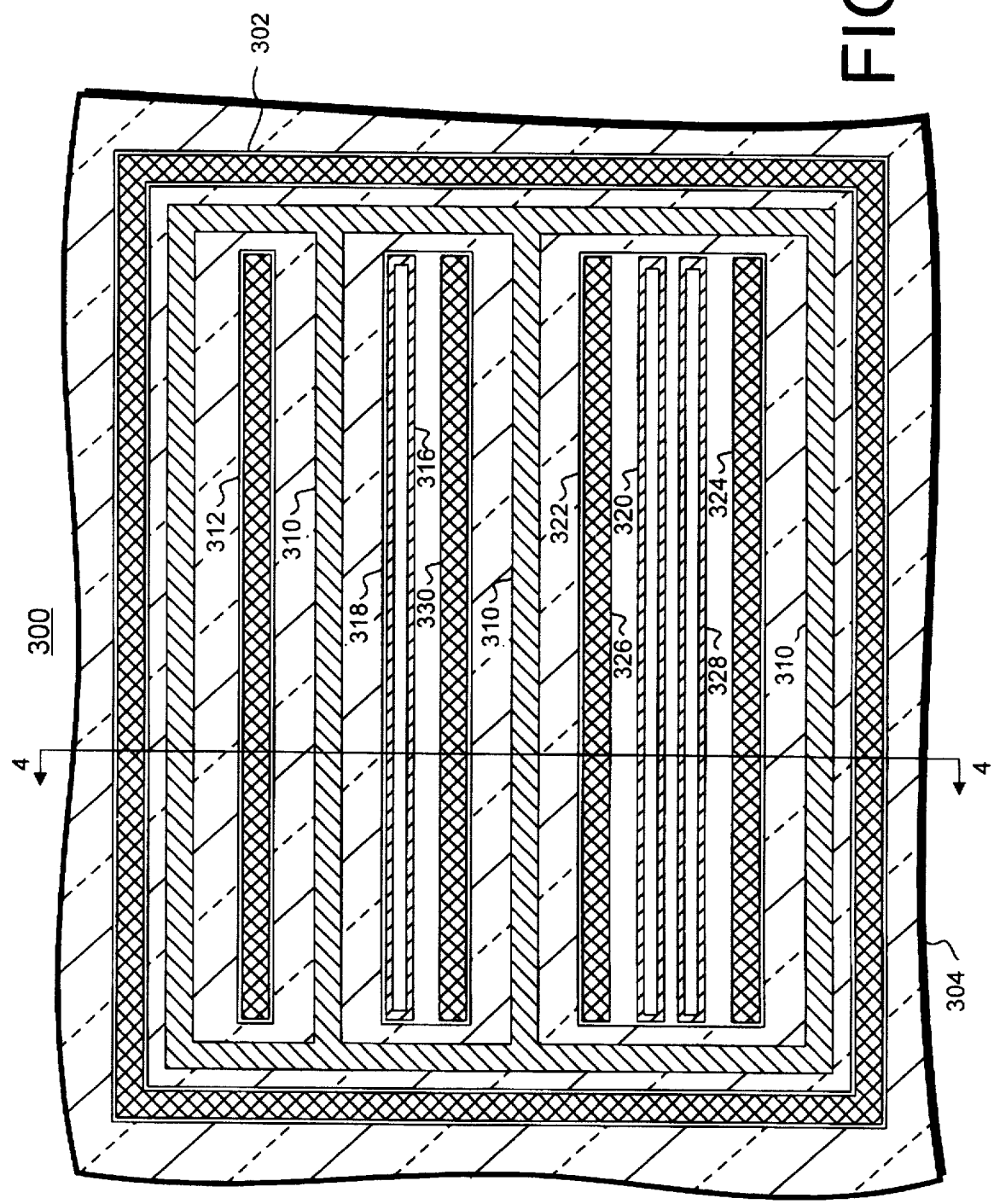
FIG. 3 is a top view schematic view of an ESD structure in accordance with the preferred embodiment of the present invention.
Figure 4:
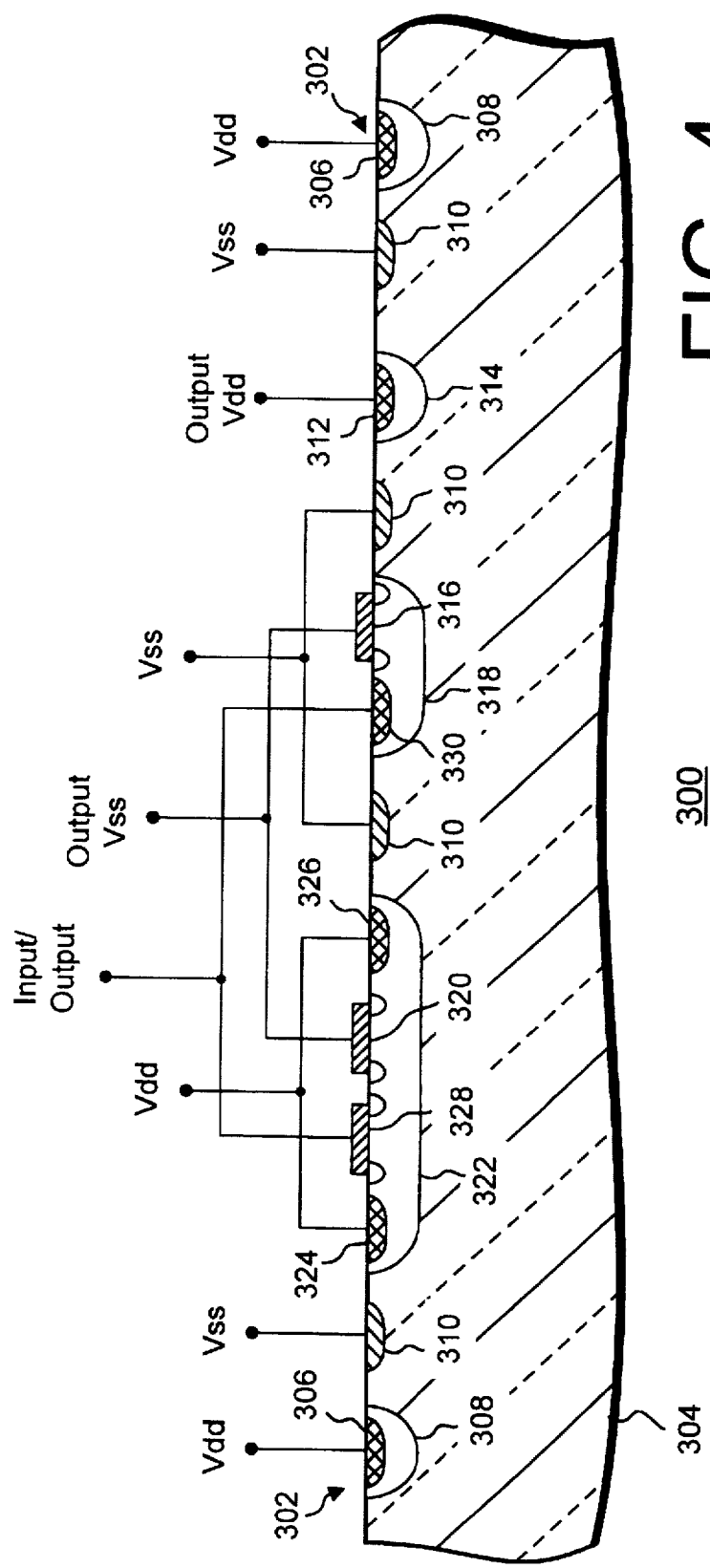
FIG. 4 is cross sectional schematic view of an ESD structure in accordance with the preferred embodiment of the present invention.

FIG. 3 is a top view schematic view of an ESD structure 300 in accordance with the preferred embodiment of the present invention. Likewise, FIG. 4 is cross sectional schematic view of ESD structure 300 taken along lines 4—4 in FIG. 3. The ESD structure 300 is configured for use in providing ESD protection to an off-chip driver circuit. However, those skilled in the art will recognize that the principles of the preferred embodiment are applicable to ESD structures for all types of applications, and the features shown in FIGS. 3 and 4 specific to an off-chip-driver are to illustrate one of many possible configurations in accordance with the preferred embodiment. Referring to FIGS. 3 and 4 together, the ESD structure 300 is preferably fabricated in a p-substrate 304. The ESD structure 300 comprises a guard ring 302 formed in a substrate 304. The guard ring 302 preferably comprises a n-diffusion 306 in an n-well 308. With the guard ring 302 connected to a positive bias Vdd, the guard ring 302 serves to collect electrons injected within the ESD structure before they can reach and damage adjacent circuits.

The illustrated embodiment ESD structure 300 has five terminals. These terminals, Vss, Vdd, Output Vdd, Output Vss, and Input/Output, connect to structures inside the guard ring 302. To use the ESD structure 300, the Output Vdd, Output Vss, and Input/Output terminals are connected to corresponding terminals on the device to be protected from ESD damage, for example, to corresponding terminals on an off-chip driver. The Vss and Vdd terminals are used to ground and bias the circuit and ESD structure 300. Output Vss and Output Vdd are separate ground and bias connections to the off-chip driver and ESD structure 300.

In particular, the ESD structure 300 is grounded through a substrate contact diffusion 310. The substrate contact diffusion 310 is interditigated around the various structures in the ESD structure 300. The substrate contact diffusion 300 is preferably a p-type diffusion that is formed directly in the substrate 104. Thus, the substrate contact diffusion 310 provides a substrate contact and ground (Vss) reference to the ESD structure 300.

Likewise, the ESD structure 300 is also connected to potential Vdd at several diffusion regions inside the guard ring 302. Vdd is connected to n-diffusion 324 and n-diffusion 326, inside n-well 322. With Vdd connected to n-well 322, the n-well 322/p-substrate 304 junction is normally reversed biased, with no current flowing to p-substrate 304.

Where the protected device is an off-chip driver, the Output Vdd and Output Vss terminals are connected to the output Vdd and output Vss of the off-chip driver. Similarly, Vdd and Vss are connected to the Vdd and Vss of the off-chip driver. Thus, any ESD pulse on the off-chip driver Vdd or Vss line can be absorbed by the ESD structure 100 through the Output Vdd or Output Vss terminals. Likewise, the Input/Output terminal is connected to an input/output for the off-chip driver. An ESD pulse on the off-chip driver input/output line can be absorbed by the ESD structure 100 through the Input/Output terminal. Of course, this is just one application for which an ESD structure can be implemented.

Figure 1:
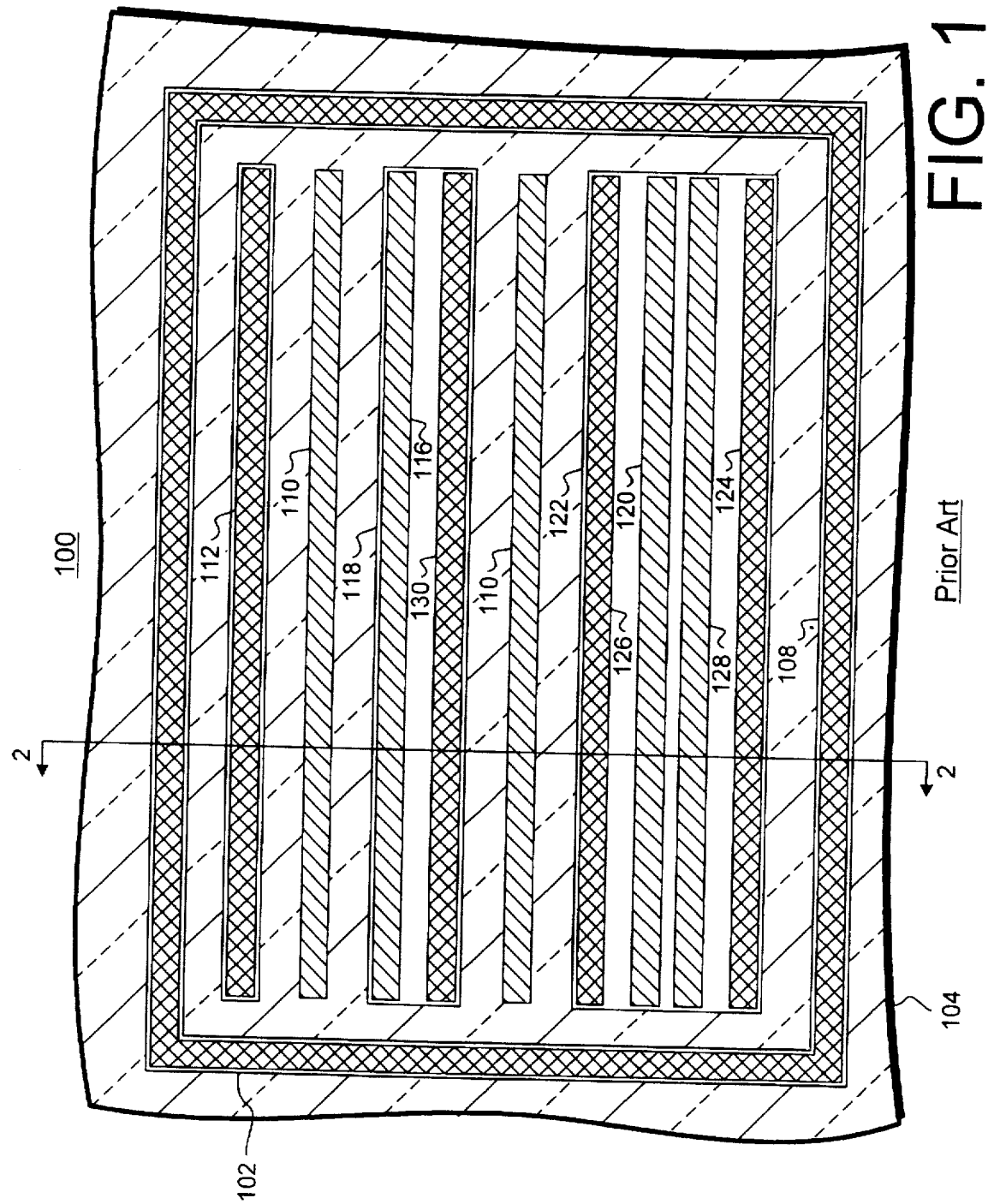
FIG. 1 is a top view schematic view of a prior art ESD structure.
Figure 2:
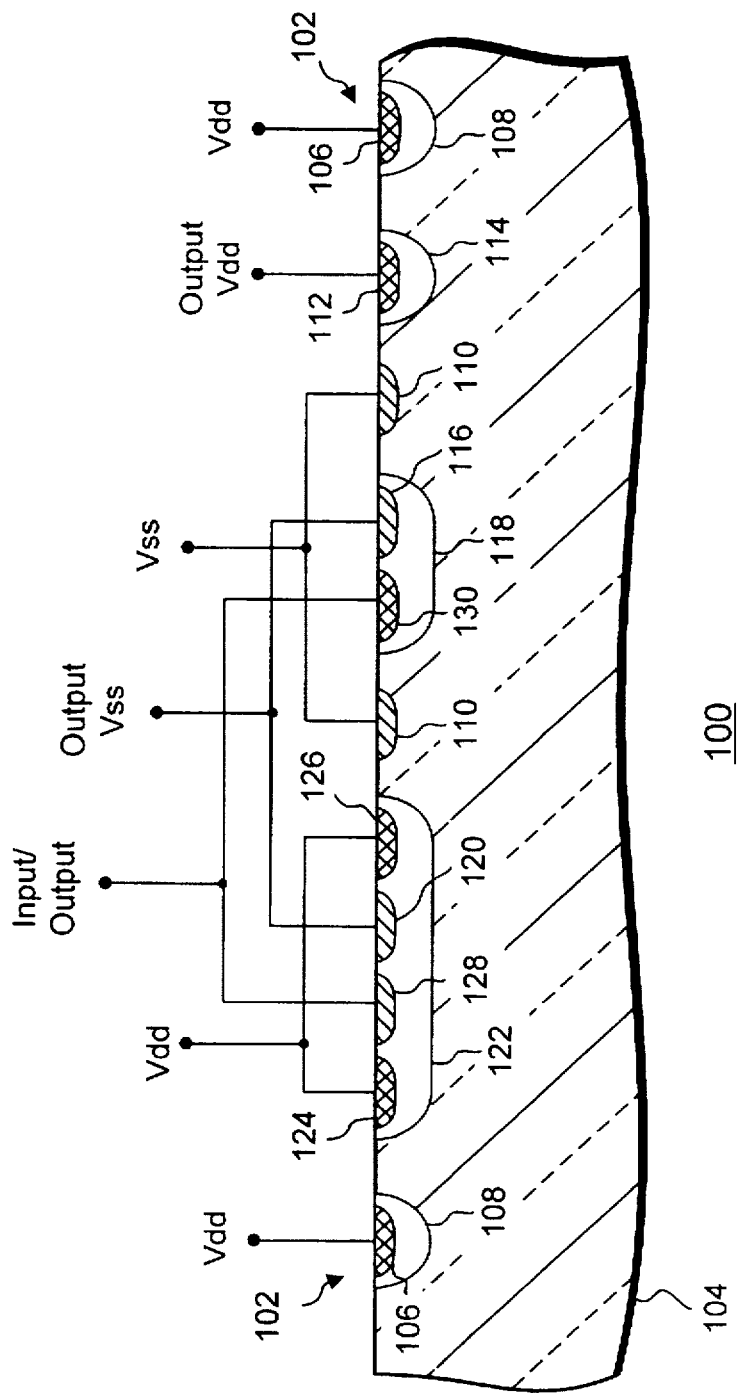
FIG. 2 is a cross sectional schematic view of a prior art ESD structure.

Thus, the ESD structure 300 is configured in a similar manner as prior art ESD structures. However, in accordance with the preferred embodiment, some semiconductor diffusions (e.g., p-diffusions 116, 120 and 128) in prior art ESD structure 100 (FIGS. 1, 2) have been replaced with contacts 316, 320 and 328. These contacts 316, 320 and 328 form Schottky barrier diodes with the underlying diffusion regions. The contacts are shown in FIG. 4 surrounded with a p-diffusion ring that reduces the electric field at the contact perimeter. This diffusion ring is, however, not needed if contact boundaries are "rounded" during the process, as will be detailed later. The Schottky barrier diode is a majority carrier device with only a negligible amount of minority carriers present when forward biased. This inhibits bipolar action in the ESD structure that can lead to latch up.

The Output Vdd terminal is connected to n-diffusion 312 in an n-well 314. As such, an ESD pulse on Output Vdd negative with respect ground will forward bias the n-well 314/p-substrate 304 junction, and the current and voltage can be safely drained to ground. Likewise, an ESD positive with respect to Vdd will cause a bias difference across the junction between the n-well 314 and p-substrate 304 diffusion to cause a reverse breakdown. The junction is designed to breakdown at a sufficiently low voltage and divert the ESD current to ground before damaging voltage appears on the circuit.

The Output Vss terminal is connected to a contact 316 in n-well 318 and to contact 320 in n-well 322. Thus an ESD pulse on Output Vss negative with respect to Vss will cause the breakdown of the contact 316/n-well 318 junction and contact 320/n-well 322 junction. In this mode, n-well 318 /substrate 304 and n-well 322/substrate 304 junctions become slightly forward biased. Likewise an ESD pulse positive with respect to Vdd will forward bias the contact 320/n-well 322 junction, allowing the current and voltage to be safely drained. Since this current consists predominantly of majority-carrier electrons and negligible hole injection occurs, there not enough minority carriers injected to cause the ESD structure 300 to latch up.

The Input/Output terminal is connected to n-diffusion 330 in n-well 318 and to contact 328 in n-well 322. Thus, an ESD pulse on the Input/Output terminal negative with respect to Vss forward biases the n-well 318/p-substrate junction such that current and voltage are safely drained to ground. Likewise, an ESD pulse positive with respect to Vdd forward biases the contact 328/n-well 322 junction, allowing current and voltage to be safely drained. This current consists predominantly of majority-carrier electrons and negligible hole injection occurs.

Figure 5:
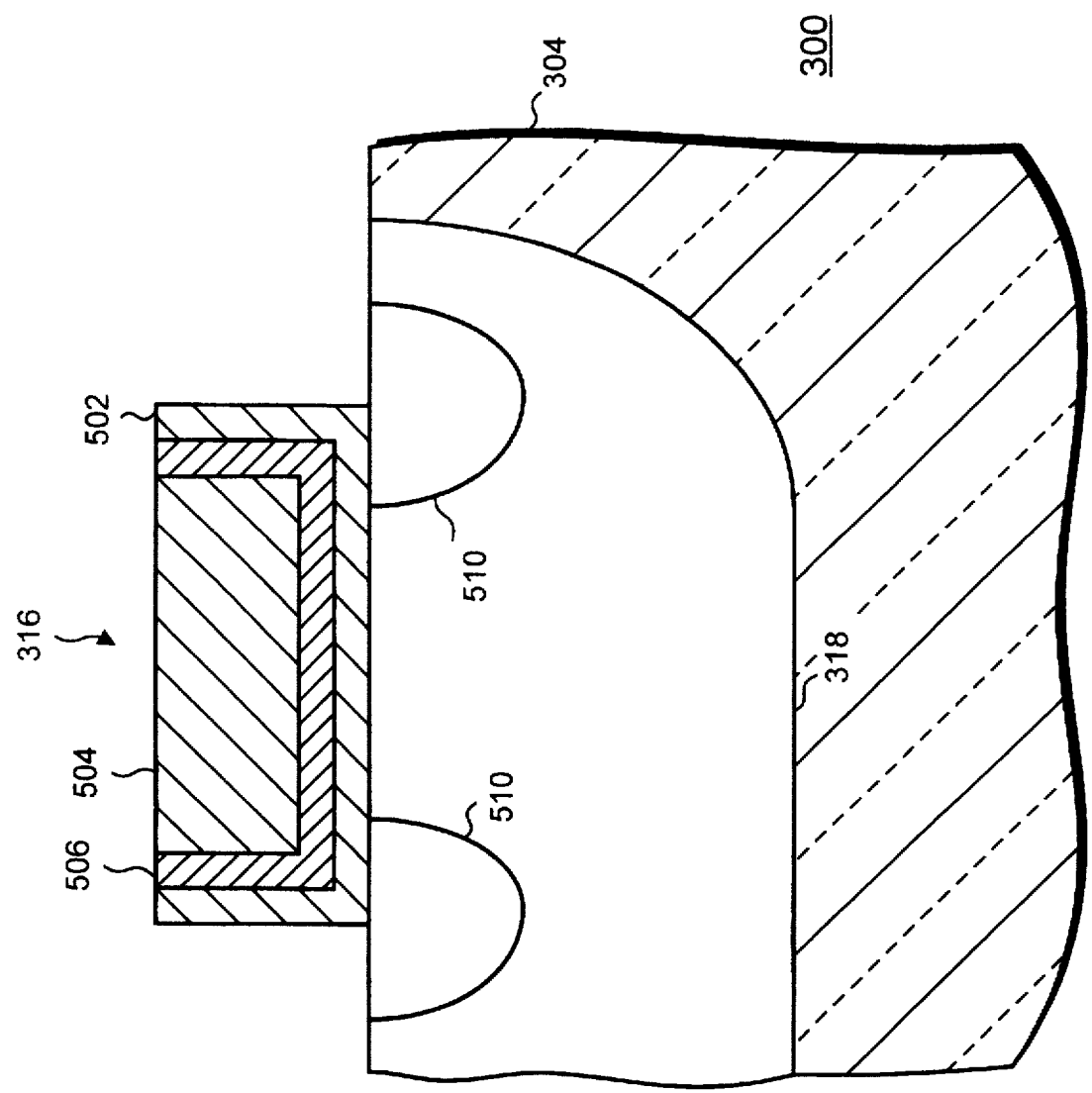
FIG. 5 is cross sectional schematic view of a portion of an ESD structure in accordance with the preferred embodiment of the present invention.

Thus, the ESD structure 300 in accordance with the preferred embodiment is similar in some respects to prior art ESD devices, some semiconductor diffusions being replaced with contacts 316, 320 and 328. In accordance with the preferred embodiment, the contacts 316, 320 and 328 form Schottky barrier diodes with the underlying semiconductor diffusions, and as such reduce the susceptibility to latch in the ESD structure 300. Turning to FIG. 5, FIG. 5 is a close up cross sectional view of contact 316 in n-well 318. The contact 316 is preferably substantially identical to the other contacts 320 and 328 of ESD structure 300.

The contact 316 preferably comprises a metal conductor material of appropriate workfunction such that a Schottky barrier diode is formed with the underlying semiconductor diffusion. In the illustrated embodiment, the contact comprises an interface layer 502, a core 504 and an intermediate layer 506. The core 504 is preferably a suitable metal conductor such as tungsten (W) selected to be compatible with conventional fabrication technologies. Likewise, the intermediate layer 506 preferably comprises a suitable conducting material such as titanium nitride (TiN). In the alternative, the intermediate layer 506 can be dispensed with altogether, depending upon fabrication techniques used.

The interface layer 502 preferably comprises a material that, when placed adjacent a semiconductor well will form a Schottky barrier interface. For example, where interface layer 502 comprises a layer of titanium silicide ($TiSi_2$) and the well is a low-to-medium doped n-well, a Schottky barrier will be formed at the interface. Thus, the material selected for interface 502 should be one that is compatible with fabrication techniques and forms a Schottky barrier with the underlying well.

For example, cobalt-silicide ($CoSi_2$) of $TiSi_2$ are suitably used where the underlying well is an low-to-medium doped p-well. Of course, these are only two of many types of interface layer 502 materials that could be used to form a Schottky barrier.

Surrounding the underside exterior perimeter of interface layer 502 is a diffusion ring 510. The diffusion ring 510 reduces the electric field strength around the corners of interface layer 502 that may lead to device failure. The diffusion ring 510 is desirable because many suitable fabrication techniques for forming contact 316 result in a contact with sharply defined corners. These sharp corners can create an excessive electric field. It is desirable that these high fields not touch the n-well directly. Thus, the diffusion ring 510 "softens" the electric field by "rounding" the corners. In the absence of sharp corners at the metal contact, this diffusion ring 510 is not needed. When a p-diffusion ring 510 is used, the structure is designed to ensure that both the SBD and the p-diffusion ring are forward biased in parallel, with most of the current carried by majority carrier injection through the SBD.

By using a contact 316 that forms a Schottky barrier diode with the underlying semiconductor well instead of a prior art PN or NP junction, the probability of latch-up is significantly reduced. In particular, in a PNP device a forward bias on a P.N. junction injects large numbers of minority carriers in both directions across the junction. These minority carriers can be swept across into the substrate in a transistor-like action and cause the ESD device to latch up. With a Schottky barrier diode in place of the junction, a forward bias conducts almost exclusively majority carriers. Thus, a forward bias causes electrons to be injected from the n-well 318 to the contact 316, but very little corresponding holes are injected into the n-well. Without holes being injected into the n-well where they can be swept to the substrate 304 in a transistor-like action, the probability of latch up is significantly reduced.

These same principles would apply in the complementary case of an ESD constructed over a p-well. In that case the majority carriers are holes and negligible minority-carrier electron injection occurs.

In effect, using a contact 316 that forms a Schottky barrier inhibits bipolar transistor action, reducing the possibility of latch-up. Thus, the preferred embodiment offers an improved ESD structure that provides effective protection from ESD while lowering the probability of latch-up occurring.

While the invention has been particularly shown and described with reference to a preferred exemplary embodiment with an dual diode ESD protection device configured for an off chip driver, it will be understood by those skilled in the art that various changes in form and details may be made therein without departing from the spirit and scope of the invention. In particular the Schottky barrier diode may be suitably used at the terminal inputs of any type of protection device where injected minority carriers would otherwise contribute to latch-up.

We claim:

1. An electrostatic discharge protection device comprising:
   a) a semiconductor substrate;
   b) a first well formed in said semiconductor substrate;
   c) a first diffusion contact formed in said first well, said first diffusion contact comprising a highly doped region, said first diffusion contact connected to a first power supply voltage;
   d) a first contact adjacent and contacting said first well, said first contact and said first well forming a first Schottky barrier diode, said first contact connected to a first input of said electrostatic discharge protection device;
   e) a second contact adjacent and contacting said first well, said second contact and said first well forming a second Schottky barrier diode, said second contact connected to a second input of said electrostatic discharge protection device;
   f) a second well formed in said semiconductor substrate;
   g) a second diffusion contact formed in said second well, said second diffusion contact comprising a highly doped region, said second diffusion contact connected to said first input of said electrostatic discharge protection device;
   h) a third contact adjacent and contacting said second well, said third contact and said second well forming a third Schottky barrier diode, said third contact connected to said second input of said electrostatic discharge protection device.

2. The electrostatic discharge protection device of claim 1 further comprising a first diffusion region formed in said first well substantially surrounding a perimeter of said first contact, a second diffusion ring region formed in said first well substantially surrounding a perimeter of said second contact, and a third diffusion ring region formed in said second well substantially surrounding a perimeter of said third contact.

3. The electrostatic discharge protection device of claim 1 wherein said first contact comprises a first core and a first interface layer, said second contact comprises a second core and a second interface layer, and said third contact comprises a third core and a third interface layer.

4. The electrostatic discharge protection device of claim 2 wherein said first, second and third cores comprises tungsten and wherein said first, second and third interface layers comprise titanium silicide.

5. The electrostatic discharge protection device of claim 1 wherein said semiconductor substrate comprises a p-type semiconductor material.

6. The electrostatic discharge protection device of claim 5 wherein said first well and said second well comprise n-type wells.

7. The electrostatic discharge protection device of claim 6 wherein said first diffusion contact, said second diffusion contact, and said third diffusion contact, comprise p+ diffusions.

8. An electrostatic discharge protection device comprising:
   a) a p-type semiconductor substrate;
   b) a first power supply input terminal;
   c) a first electrostatic discharge protection device input terminal;
   d) a second electrostatic discharge protection device input terminal;
   e) a first n-well formed in said semiconductor substrate;
   f) a first n-type diffusion contact formed in said first n-well, said first n-type diffusion contact comprising a highly doped n-type region, said first n-type diffusion contact connected to said first power supply input terminal;
   g) a second n-type diffusion contact formed in said first n-well, said second n-type diffusion contact comprising a highly doped n-type region, said second n-type diffusion contact connected to said first power supply input terminal;
   h) a first contact adjacent and contacting said first n-well, said first contact and said first n-well forming a first Schottky barrier diode, wherein said first contact comprises a tungsten core and a titanium silicide interface layer, said first contact connected to said first electrostatic discharge protection device input terminal;
   i) a first diffusion guard ring formed in said first n-well substantially surrounding a perimeter of said first contact;
   j) a second contact adjacent and contacting said first n-well, said second contact and said first n-well forming a second Schottky barrier diode, wherein said second contact comprises a tungsten core and a titanium silicide interface layer, said second contact connected to said second electrostatic discharge protection device input terminal;
   k) a second diffusion guard ring formed in said second n-well substantially surrounding a perimeter of said second contact;
   l) a second n-well formed in said semiconductor substrate;
   m) a third n-type diffusion contact formed in said second n-well, said second n-type diffusion contact comprising a highly doped n-type region, said second n-type diffusion contact connected to said first electrostatic discharge protection device input terminal;
   n) a third contact adjacent and contacting said second n-well, said third contact and said second n-well forming a third Schottky barrier diode, wherein said third contact comprises a tungsten core and a titanium silicide interface layer, said third contact connected to said second electrostatic discharge protection device input terminal;
   o) a third diffusion guard ring formed in said second n-well substantially surrounding a perimeter of said third contact.

* * * * *

UNITED STATES PATENT AND TRADEMARK OFFICE
CERTIFICATE OF CORRECTION

PATENT NO. : 5,763,918
DATED : June 9, 1998
INVENTOR(S) : El-Kareh et al.

It is certified that error appears in the above-identified patent and that said Letters Patent is hereby corrected as shown below:

On the title page, item [73] Assignee:

"International Business Machines Corp., Armonk N.Y." should read --International Business Machines Corporation, Armonk N.Y., and Kabushiki Kaisha Toshiba, Kawasaki, Japan--.

Signed and Sealed this

Twenty-third Day of February, 1999

*Attest:*

Q. TODD DICKINSON

*Attesting Officer*     *Acting Commissioner of Patents and Trademarks*